United States Patent
Yoshikawa et al.

(10) Patent No.: US 8,344,766 B2
(45) Date of Patent: Jan. 1, 2013

(54) RESET CIRCUIT OF HIGH VOLTAGE CIRCUIT

(75) Inventors: Sadao Yoshikawa, Gifu (JP); Toshiki Rai, Gifu (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 60 days.

(21) Appl. No.: 11/939,431

(22) Filed: Nov. 13, 2007

(65) Prior Publication Data
US 2008/0111605 A1    May 15, 2008

(30) Foreign Application Priority Data
Nov. 14, 2006    (JP) .................. 2006-307460

(51) Int. Cl.
*H03L 7/00* (2006.01)
*H03K 3/02* (2006.01)
*G05F 1/10* (2006.01)
*G05F 3/02* (2006.01)

(52) U.S. Cl. ........ 327/143; 327/142; 327/198; 327/536; 327/537

(58) Field of Classification Search .................. 327/142, 327/143, 198, 536, 537
See application file for complete search history.

(56) References Cited

U.S. PATENT DOCUMENTS

| | | | | |
|---|---|---|---|---|
| 4,471,235 | A * | 9/1984 | Sakhuja et al. | 327/34 |
| 5,469,099 | A * | 11/1995 | Konishi | 327/198 |
| 6,515,523 | B1 * | 2/2003 | Bikulcius | 327/142 |
| 6,768,354 | B2 * | 7/2004 | Yamazaki et al. | 327/143 |
| 6,801,060 | B2 * | 10/2004 | Ikehashi et al. | 327/80 |
| 6,924,676 | B2 * | 8/2005 | Marotta | 327/143 |

FOREIGN PATENT DOCUMENTS
JP    2004-135414    4/2004

* cited by examiner

*Primary Examiner* — Lincoln Donovan
*Assistant Examiner* — Colleen O Toole
(74) *Attorney, Agent, or Firm* — Morrison & Foerster LLP

(57) ABSTRACT

A reset transistor is prevented from being deteriorated when power-down occurs during a programming operation or an erasing operation. It is made possible to protect the reset transistor as well as other transistors in a circuit to which a high voltage is applied when the power-down occurs during the erasing operation on an EEPROM, because the system is not reset all at once based only on a first reset signal POR of a power-on reset circuit, but is reset based on the first reset signal POR and a low voltage detection signal LD from a low voltage detection circuit so that the reset transistor is not turned on while the high voltage is applied to it.

2 Claims, 4 Drawing Sheets

RESET CIRCUIT OF HIGH VOLTAGE CIRCUIT

CROSS-REFERENCE OF THE INVENTION

This application claims priority from Japanese Patent Application No. 2006-307460, the content of which is incorporated herein by reference in its entirety.

BACKGROUND OF THE INVENTION

1. Field of the Invention

This invention relates to a reset circuit that resets a high voltage circuit to which a high voltage generated by a voltage boosting circuit is applied.

2. Description of the Related Art

In an EEPROM (Electrically Erasable and Programmable Memory) such as a flash memory, electric charges are generally injected into a floating gate by providing a memory cell with a channel current in a programming operation while a high voltage is applied to a source of the memory cell. Also, when erasing the program, the high voltage is applied to a gate of the memory cell or a substrate to extract the electric charges injected into the floating gate to the gate or the substrate. A charge pump circuit to generate the high voltage is embedded in the EEPROM.

FIG. 7 is a block diagram showing circuits in the EEPROM as described above. The EEPROM is provided with a memory block 1 including a plurality of memory cells, analog circuit block 2 and a digital circuit block 3. Also, a power-on reset circuit 4 that detects power-on and power-down and generates a reset signal is provided. And a whole system of the EEPROM is reset in response to the reset signal.

The high voltage outputted from the charge pump circuit is applied to the memory block 1 and the analog circuit block 2 during the programming operation and the erasing operation. Transistors in the memory block 1 and analog circuit block 2 are made of high withstand voltage transistors that can withstand the high voltage. Therefore, there is no problem in applying the high voltage to the transistors while they are turned off. However, when the transistor is turned from an OFF state to an ON state to make a drain current flow while the high voltage is applied to its drain, a drain withstand voltage is reduced to cause a breakdown and thereby deterioration of the transistor is induced. Thus, in order to protect the transistors, the transistors are configured not to make the switching operation while the high voltage is applied to them.

The EEPROM incorporating the charge pump circuit is disclosed in Japanese Patent Application Publication No. 2004-135414, for example.

When a power-down occurs during the programming operation or the erasing operation, however, the power-on reset circuit 4 is put into operation to reset the whole system in a stroke. At that time, although the operation of the charge pump circuit is stopped, the high voltage is not reduced immediately. As a result, there is a possibility that a reset transistor for resetting is turned on while the high voltage is applied and the reset transistor is thereby deteriorated.

SUMMARY OF THE INVENTION

This invention is directed to solve the problem addressed above, and offers a reset circuit of a high voltage circuit including a voltage boosting circuit that boosts a power supply voltage to generate a high voltage as an output voltage, a reset transistor provided in the high voltage circuit to which the high voltage is applied, a first reset circuit that detects power-on and power-down and generates a first reset signal, a voltage boosting control circuit that halts an operation of the voltage boosting circuit based on the first reset signal, a low voltage detection circuit that detects reduction in the high voltage generated by the voltage boosting circuit and outputs a low voltage detection signal, and a second reset circuit that generates a second reset signal based on the first reset signal and the low voltage detection signal, wherein the high voltage circuit is reset by turning on the reset transistor based on the second reset signal.

DETAILED DESCRIPTION OF THE INVENTION

Figure 1:
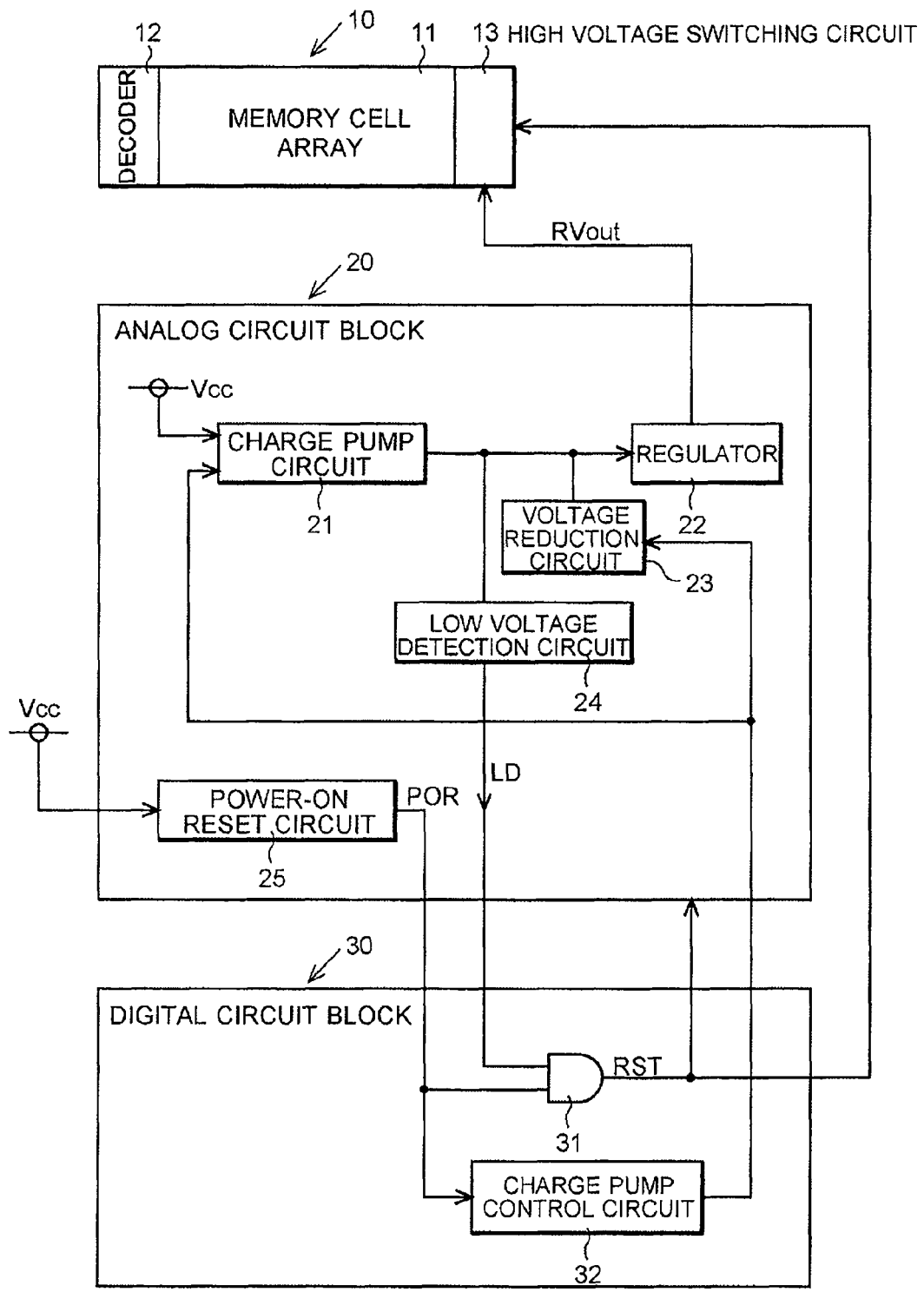
FIG. 1 is a block diagram showing circuits in an EEPROM according to an embodiment of this invention.

Next, an embodiment of this invention will be explained, taking up an EEPROM as an example. FIG. 1 is a block diagram showing circuits in the EEPROM. The EEPROM is provided with a memory block 10, an analog circuit block 20 and a digital circuit block 30.

The memory block 10 is provided with a memory array 11 made of a plurality of memory cells arrayed in a matrix form and a decoder 12 that selects a certain cell out of the memory array 11. Each of the memory cells is provided with a source, a drain, a floating gate disposed on a channel region through a gate insulation film and a gate disposed on the floating gate through an insulation film. The memory block 10 is also provided with a high voltage switching circuit 13 that applies a high voltage from a charge pump circuit 21 to the source or the gate of the memory cell selected by the decoder 12.

The analog circuit block 20 is provided with the charge pump circuit 21 that boosts a power supply voltage Vcc to generate the high voltage and a regulator 22 that adjusts the high voltage generated by the charge pump circuit 21 to a desired high voltage HV. An output voltage RVout from the regulator 22 is applied to the high voltage switching circuit 13.

Figure 2:
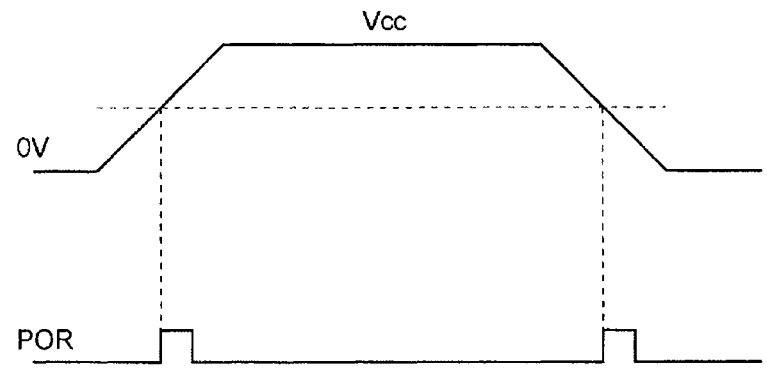
FIG. 2 is an operational waveform diagram of a power-on reset circuit according to the embodiment of this invention.

The analog circuit block 20 is also provided with a voltage reduction circuit 23 that reduces the output voltage of the charge pump circuit 21 down to a predetermined voltage (power supply voltage Vcc, for example) when the charge pump circuit 21 halts its operation. The analog circuit block 20 is also provided with a low voltage detection circuit 24 that outputs a low voltage detection signal LD of a high level when the output voltage of the charge pump circuit 21 is reduced to a predetermined low voltage. The analog circuit block 20 is also provided with a power-on reset circuit 25 that detects power-on and power-down and generates a first reset signal POR of the high level. FIG. 2 shows an operational waveform regarding the power-on reset circuit 25. In the drawing, the top level of the voltage is the power supply voltage (Vcc), and the bottom level is the ground voltage (zero volt).

The digital circuit block 30 is provided with an overall reset circuit 31 and a charge pump control circuit 32. The overall reset circuit 31 is made of an AND circuit to which the low voltage detection signal LD and the first reset signal POR are inputted, and outputs a second reset signal RST of the high level when both of the input signals are at the high level. All the system of the EEPROM is reset by the second reset signal RST. The second reset signal RST is provided to the high voltage switching circuit 13.

The charge pump control circuit 32 controls start and stop of the operation of the charge pump circuit 21. The charge pump control circuit 32 stops the operation of the charge pump circuit 21 and puts the voltage reduction circuit 23 into operation when the first reset signal POR is generated from the power-on reset circuit 24.

Figure 3:
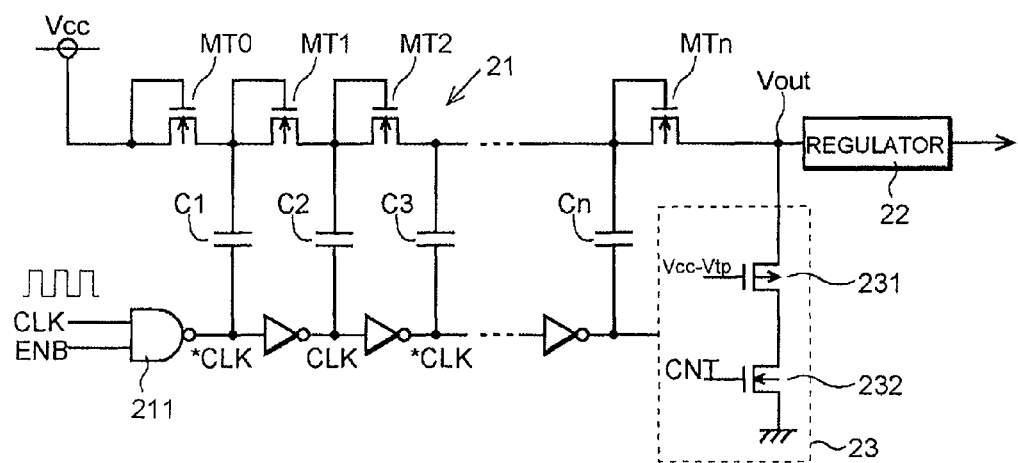
FIG. 3 is a circuit diagram showing a charge pump circuit and a voltage reduction circuit according to the embodiment of this invention.

FIG. 3 shows a concrete circuit diagram of the charge pump circuit 21 and the voltage reduction circuit 23. The charge pump circuit 21 is provided with charge transfer MOS transistors MT0-MTn and capacitors C1-Cn each having a terminal connected with a connecting node between the charge transfer MOS transistors MT0-MTn. Each of the charge transfer MOS transistors MT0-MTn is made of an N-channel type MOS transistor having a source and a gate connected with each other (diode connection). The power supply voltage Vcc is applied to a source of the charge transfer MOS transistor MT0 in a first stage. The charge pomp circuit 21 is provided with a NAND circuit 211 that controls providing another terminal of each of the capacitors C1-Cn with a clock.

When an enable signal ENB becomes the high level through the control of the charge pump control circuit 32, either a clock CLK or an inverted clock *CLK is applied through the NAND circuit 211 to another terminal of each of the capacitors C1-Cn alternately. Then electric charges are transferred through the charge transfer MOS transistors MT0-MTn as the capacitors C1-Cn are charged and discharged to obtain a high voltage that is an output voltage Vout=(n+1)Vcc. Here, a voltage loss due to the charge transfer MOS transistors MT0-MTn is neglected and the amplitude of the clocks CLK and *CLK is Vcc. When the enable signal ENB turns to the low level through the control of the charge pump control circuit 32, an output of the NAND circuit 211 is fixed at the high level to stop the operation of the charge pump circuit 21.

The voltage reduction circuit 23 is composed of a P-channel type MOS transistor 231 and an N-channel type MOS transistor 232 connected in series between an output terminal of the charge pump circuit 21 and a ground. A voltage (Vcc-Vtp) is applied to a gate of the P-channel type MOS transistor 231. Vtp represents a threshold voltage of the P-channel type MOS transistor 231. A voltage reduction control signal CNT from the charge pump control circuit 32 is applied to a gate of the N-channel type MOS transistor 232.

When the operation of the charge pump circuit 21 is stopped through the control of the charge pump control circuit 32, the voltage reduction control signal CNT becomes the high level and the N-channel type MOS transistor 232 is turned on. Then a current flows from the output terminal to the ground through the P-channel type MOS transistor 231 and the N-channel type MOS transistor 232 to reduce the output voltage Vout. The P-channel type MOS transistor 231 is turned off when the output voltage Vout is reduced to Vcc. In other words, the voltage reduction circuit 23 reduces the output voltage Vout down to Vcc.

Figure 4:
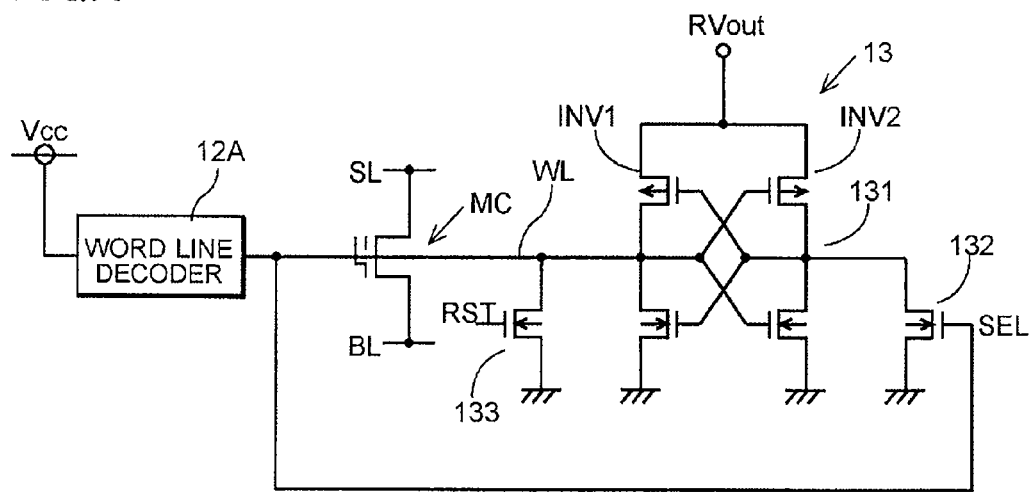
FIG. 4 is a circuit diagram showing a high voltage switching circuit according to the embodiment of this invention.

FIG. 4 shows a concrete circuit diagram of the high voltage switching circuit 13 in the memory block 10. A memory cell MC is composed of a transistor having a floating gate, a gate connected with a word line WL, a source connected with a source line SL and a drain connected with a bit line BL. When the word line WL is selected by a word line decoder 12A, a word line selection signal of the high level (Vcc level) is applied to the word line WL. The high voltage switching circuit 13 applies the high voltage to the word line WL in order to erase the program when the word line WL is selected. The high voltage switching circuit 13 is composed of two inverters INV1 and INV2 having inputs and outputs cross-connected with each other to form a flip-flop, a set MOS transistor 132 for setting and a reset MOS transistor 133 for resetting. The output voltage RVout from the regulator 22 is supplied to the two inverters INV1 and INV2 as a power supply voltage. Note that only one word line WL and only one memory cell MC are shown in FIG. 3 for the sake of simplicity of explanation.

The set MOS transistor 132 is an N-channel type high withstand voltage transistor having a drain connected to an output of the inverter INV2 and a gate to which the word line selection signal is applied. The reset MOS transistor 133 is an N-channel type high withstand voltage transistor having a drain connected to the word line WL and a gate to which the second reset signal RST from the overall reset circuit 31 is applied.

Figure 5:
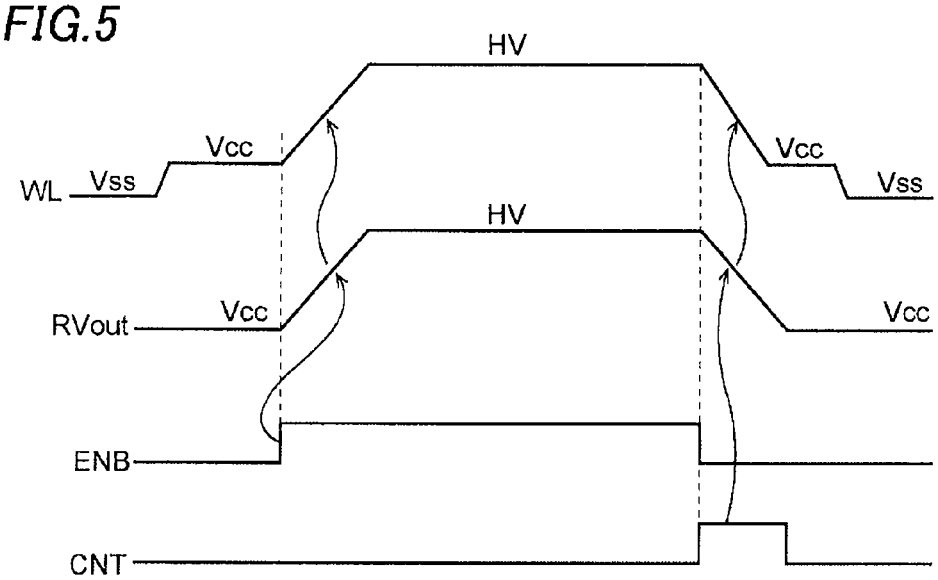
FIG. 5 is an operational waveform diagram showing an erasing operation according the embodiment of this invention.

An operation of the EEPROM structured as described above is explained hereafter. A normal operation (erasing operation) is explained referring to FIG. 5. First, when the word line WL is selected by the word line decoder 12A, the word line WL is raised to the high level (Vcc level) and the set MOS transistor 132 is turned on. Meanwhile, the reset MOS transistor 133 is turned off. After that, when the enable signal ENB is raised to the high level through the control of the charge pump control circuit 32, the charge pump circuit 21 starts operation to raise the output voltage RVout from the regulator 22 gradually to the high voltage HV. A voltage on the word line WL is also raised to the high voltage HV through the high voltage switching circuit 13 in accordance with that. The source line SL and the bit line BL are set at the low level (ground level), and the program in the memory cell MC is erased by extracting the charges injected in the floating gate to the gate.

After that, when the enable signal ENB is reduced to the low level and the voltage reduction control signal CNT is raised to the high level through the control of the charge pump control circuit 32, the charge pump circuit 21 stops the operation and the voltage reduction circuit 23 is put into operation to reduce the output voltage of the charge pump circuit 21 and the output voltage RVout from the regulator 22 down to Vcc. With this, the voltage on the word line WL is also reduced from the high voltage HV to Vcc. The voltage on the word line WL is later reduced to the ground voltage Vss as the word line selection signal from the word line decoder 12A turns to the low level.

Figure 6:
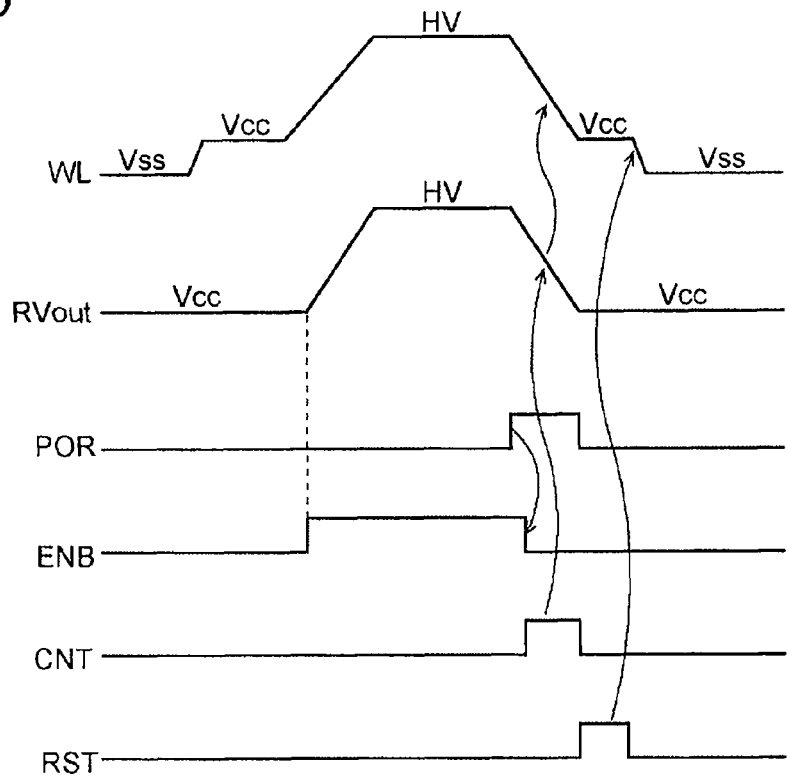
FIG. 6 is an operational waveform diagram showing an operation when power-down occurs during the erasing operation according to the embodiment of this invention.
Figure 7:
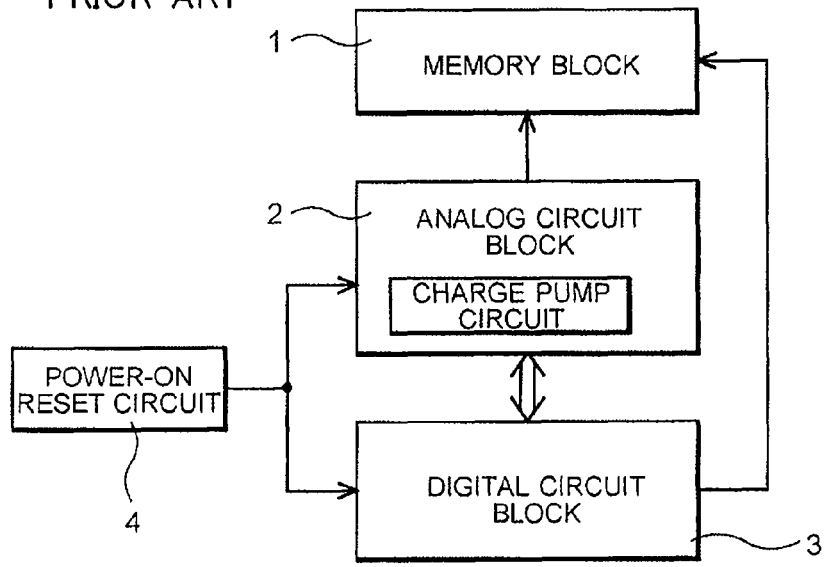
FIG. 7 is a block diagram showing circuits in a conventional EEPROM.

Next, there is explained a case in which the power-down occurs during the erasing operation, that is, while the high voltage HV is generated, the power-on reset circuit 25 is put into operation, referring to FIG. 6. A power-down, in this sense, means a state of a device where it is cut off from its power supply, or a state where the power voltage is decreasing to a ground level. The first reset signal POR is generated by the power-on reset circuit 25. When the enable signal ENB is reduced to the low level and the voltage reduction control signal CNT is raised to the high level through the control of the charge pump control circuit 32 based on the above, the charge pump circuit 21 stops the operation and the voltage reduction circuit 23 is put into operation to reduce the output voltage of the charge pump circuit 21 and the output voltage RVout of the regulator 22 from the high voltage HV to Vcc. With this, the voltage on the word line WL is also reduced from the high voltage HV to Vcc by the high voltage switching circuit 13. The low voltage detection circuit 24 outputs the low voltage detection signal LD of the high level when the output voltage of the charge pump circuit 21 is reduced to the predetermined voltage (approximately Vcc). With this, the overall reset circuit 31 generates the second reset signal RST. The reset MOS transistor 133 is turned on based on the second reset signal RST to reset the high voltage switching circuit 13. That is, an output voltage of the inverter INV1 (voltage on the word line WL) is set at the ground voltage Vss. The possibility that the reset MOS transistor 133 would be deteriorated is eliminated because the voltage on the word line WL has been reduced from the high voltage HV to a low enough voltage by the time the reset MOS transistor 133 is turned on.

In summary, it is made possible to protect the reset MOS transistor 133 as well as other transistors in the circuit to which the high voltage is applied even when the power-down occurs during the erasing operation, because the system is not reset all at once based only on the first reset signal POR of the power-on reset circuit 25, but is reset based on the first reset signal POR and the low voltage detection signal LD so that the reset MOS transistor 133 is not turned on while the high voltage HV is applied to it.

Although the high voltage switching circuit 13 for the erasing is explained as an example in the embodiment of this invention, this invention may be applied to a reset circuit in a case where the power-down occurs during the programming operation, since the high voltage switching circuit 13 can be used as a circuit to provide the source line SL with the high voltage during the programming. Although the EEPROM is described as ad example in the embodiment of this invention, the invention may be widely applied as a reset circuit of a system in which a high voltage is generated.

According to the embodiment of this invention, in the case where the power-down occurs while the high voltage is generated, the reset operation can be performed while preventing the deterioration of the reset transistor, because the reset transistor is turned on after the reduction in the output voltage of the boosting circuit (the charge pump circuit, for example) is detected.

What is claimed is:

1. A reset circuit device comprising:
   a voltage boosting circuit that boosts a power supply voltage and generates a high voltage that is higher than a stable voltage of the power supply voltage as an output voltage;
   a reset transistor provided in a high voltage circuit to which the high voltage is applied;
   a first reset circuit;
   a voltage boosting control circuit;
   a low voltage detection circuit;
   a second reset circuit; and
   a voltage reduction circuit that reduces the output voltage of the voltage boosting circuit down to the power supply voltage,
   wherein the reset circuit device is configured so that, at a time of power-down, the first reset circuit detects the power-down and outputs a first reset signal, the voltage boosting control circuit halts an operation of the voltage boosting circuit based on the first reset signal, the low voltage detection circuit detects a reduction in the output voltage of the voltage boosting circuit after the halting and outputs a low voltage detection signal, the second reset circuit generates a second reset signal based on the first reset signal and the low voltage detection signal, the reset transistor resets the high voltage circuits in response to the second reset signal,
   the voltage boosting control circuit is configured not to increase the output voltage generated by the voltage boosting circuit any time during the power-down while the low voltage detection signal is being output, and
   the voltage reduction circuit is configured to receive directly an output of the voltage boosting control circuit when the voltage boosting control circuit receives the first reset signal so as to reduce the output voltage of the voltage boosting circuit down to the power supply voltage.

2. The reset circuit device of claim 1, wherein the second reset circuit comprises a logic circuit that produces a logical product of the first reset signal and the low voltage detection signal.

* * * * *